United States Patent
Kageyama et al.

(10) Patent No.: US 10,870,578 B2
(45) Date of Patent: Dec. 22, 2020

(54) BLACK-FILM-FORMING MIXED POWDER

(71) Applicant: MITSUBISHI MATERIALS ELECTRONIC CHEMICALS CO., LTD., Akita (JP)

(72) Inventors: Kensuke Kageyama, Akita (JP); Takashi Konishi, Akita (JP)

(73) Assignee: MITSUBISHI MATERIALS ELECTRONIC CHEMICALS CO., LTD., Akita (JP)

(*) Notice: Subject to any disclaimer, the term of this patent is extended or adjusted under 35 U.S.C. 154(b) by 0 days.

(21) Appl. No.: 16/462,341

(22) PCT Filed: Oct. 30, 2017

(86) PCT No.: PCT/JP2017/039102
§ 371 (c)(1),
(2) Date: May 20, 2019

(87) PCT Pub. No.: WO2018/096874
PCT Pub. Date: May 31, 2018

(65) Prior Publication Data
US 2019/0367364 A1 Dec. 5, 2019

(30) Foreign Application Priority Data
Nov. 22, 2016 (JP) ................. 2016-226586

(51) Int. Cl.
*C01B 21/076* (2006.01)
*C01B 21/082* (2006.01)
*G03F 7/16* (2006.01)

(52) U.S. Cl.
CPC ........ *C01B 21/076* (2013.01); *C01B 21/0821* (2013.01); *G03F 7/164* (2013.01)

(58) Field of Classification Search
None
See application file for complete search history.

(56) References Cited

U.S. PATENT DOCUMENTS 3,669,695 A * 6/1972 Iler .................. C04B 35/58007
501/87
5,002,646 A * 3/1991 Egerton .............. C01B 21/0763
204/177
(Continued)

FOREIGN PATENT DOCUMENTS

JP 63011507 A * 1/1988 ........... C01B 21/076
JP H11-263639 A 9/1999
(Continued)

OTHER PUBLICATIONS

Chau et al., "Microwave plasma synthesis of TiN and ZrN nanopowders", Materials Letters, Aug. 22, 2006, pp. 1583-1587.
(Continued)

*Primary Examiner* — Guinever S Gregorio
(74) *Attorney, Agent, or Firm* — Greenblum & Bernstein, P.L.C.

(57) ABSTRACT

Provided is a black-film-forming mixed powder containing: (A) a zirconium nitride powder that does not contain zirconium dioxide, a low-order oxide of zirconium, or a low-order oxynitride of zirconium; and (B) a titanium nitride powder or a titanium oxynitride powder, wherein the content ratio of (A) the zirconium nitride powder and (B) the titanium nitride powder or the titanium oxynitride powder is within the range of 90:10 to 25:75 in terms of mass ratio (A:B). When the light transmittance at a wavelength of 400 nm is X, the light transmittance at a wavelength of 550 nm is Y, and the light transmittance at a wavelength of 1,000 nm is Z in a spectrum of a dispersion in which the mixed powder is dispersed in a concentration of 50 ppm, X>10%, Y<10%, Z<16%, X/Y is 1.25 or more, and Z/Y is 2.0 or less.

3 Claims, 1 Drawing Sheet

(56) References Cited

U.S. PATENT DOCUMENTS

| | | | | |
|---|---|---|---|---|
| 5,395,606 | A | * | 3/1995 | Xiao ................ C01B 21/06 423/411 |
| 8,759,741 | B2 | * | 6/2014 | Kubota ............ C08F 290/064 250/214.1 |
| 2008/0017835 | A1 | * | 1/2008 | Takahashi ............ B82Y 30/00 252/519.12 |
| 2014/0011125 | A1 | | 1/2014 | Inoue et al. |

FOREIGN PATENT DOCUMENTS

| | | | | |
|---|---|---|---|---|
| JP | 2000-143985 | A | | 5/2000 |
| JP | 2001-106525 | A | | 4/2001 |
| JP | 2004-142177 | A | | 5/2004 |
| JP | 2008-266045 | A | | 11/2008 |
| JP | 2009-091205 | A | | 4/2009 |
| JP | 2012096946 | A | * | 5/2012 |
| WO | 2012/133148 | A1 | | 10/2012 |

OTHER PUBLICATIONS

U.S. Appl. No. 16/336,634 to Kensuke Kageyama et al., which was filed Mar. 26, 2019.

International Search Report issued in WIPO Patent Application No. PCT/JP2017/039102, dated Dec. 12, 2017, together with an English-language translation.

Written Opinion of the International Searching Authority issued in WIPO Patent Application No. PCT/JP2017/039102, dated Dec. 12, 2017, together with an English-language translation.

Notification of Reasons for Refusal for Japanese Application No. 2016-226586, dated Nov. 8, 2019; and English-language translation thereof.

International Preliminary Report on Patentability for related International Application No. PCT/JP2017/039102, dated May 28, 2019.

* cited by examiner

BLACK-FILM-FORMING MIXED POWDER

TECHNICAL FIELD

The present invention relates to a black-film-forming mixed powder suitably used as an insulating black pigment and a production method therefor. More particularly, it relates to a black-film-forming mixed powder which can form a patterning film with high resolution by transmitting a light with a wavelength of 365 nm to 410 nm when forming a black patterning film as a black pigment and has a high light shielding property of the formed patterning film by shielding a light of a wavelength of 500 nm to 1,100 nm and a production method therefor. This international application claims priority right based on Japanese Patent Application No. 226586 (Japanese Patent Application No. 2016-226586) filed on Nov. 22, 2016, and the entire contents of Japanese Patent Application No. 2016-226586 are incorporated into this international application.

BACKGROUND ART

This type of a black pigment is used for a black matrix of an image forming element such as a color filter of a liquid crystal display and the like, by dispersing in a photosensitive resin to prepare a black photosensitive composition, applying this composition to a substrate to form a photoresist film, and irradiating ultraviolet rays to the photoresist film by a photolithography method to expose the photoresist film whereby forming a patterning film. Since carbon black as a conventional black pigment has conductivity, it is not suitable for applications requiring insulation properties. Further, since carbon black shields ultraviolet rays, it is difficult to form a patterning film with high resolution, and the light shielding property is inferior in the wavelength range of visible light to near infrared light.

Conventionally, as a black pigment with high insulating property, there has been disclosed a high resistance black powder containing a black powder comprising titanium oxynitride having a specific composition also called titanium black, and an insulating powder comprising at least one kind of $Y_2O_3$, $ZrO_2$, $Al_2O_3$, $SiO_2$, $TiO_2$ and $V_2O_5$ (for example, see Patent Document 1.). According to this black powder, it is said to be suitable as a black matrix of a color filter since it has a high resistance value and is excellent in light shielding property when it is formed into a black film. In Patent document 1, there are described that a high resistance black powder containing the titanium oxynitride powder and an insulation powder is produced by adding the insulation powder to titanium oxide as a raw material and subjecting to nitriding and reducing treatment, or by adding the insulation powder after nitriding and reducing treatment of titanium oxide, and the nitriding and reducing treatment of titanium oxide is carried out, for example, by heating the titanium oxide powder as a raw material to 700 to 1,000° C. in an atmosphere of a reducing gas such as ammonia and the like.

Further, as a material which is an insulating black pigment containing zirconium nitride, there is disclosed a fine particle low-order oxide of zirconium-zirconium nitride composite characterized by having a peak corresponding to a low-order oxide of zirconium and a peak corresponding to zirconium nitride in the X-ray diffraction profile, and a specific surface area of 10 to 60 $m^2/g$ (for example, see Patent Document 2.). This fine particle low-order oxide of zirconium-zirconium nitride composite is produced by the process of sintering a mixture of zirconium dioxide or zirconium hydroxide, magnesium oxide and metallic magnesium in a stream of a nitrogen gas or an inert gas containing a nitrogen gas at 650 to 800° C. The above-mentioned fine particle low-order oxide of zirconium-zirconium nitride composite can be used as a black fine particle material having low electric conductivity, is said to be used as a fine particle black pigment having low electric conductivity for a black matrix of displays such as televisions in which carbon black or the like is used, and according to the above-mentioned production method, it is said that the above-mentioned fine particle low-order oxide of zirconium-zirconium nitride composite can be produced (mass-produced) on an industrial scale.

PRIOR ART DOCUMENTS

Patent Documents

Patent Document 1: JP 2008-266045A (Claim 1, Claim 5, paragraph [0002], paragraph [0010], paragraph [0020] and paragraph [0021])

Patent Document 2: JP 2009-091205A (Claim 1, Claim 2, paragraph [0015] and paragraph [0016])

SUMMARY OF THE INVENTION

Problems to be Solved by the Invention

However, in the black powder referred to as titanium black disclosed in Patent Document 1 and the fine particle low-order oxide of zirconium-zirconium nitride composite disclosed in Patent Document 2, in the case where they are used as a black pigment, in order to obtain higher shielding property by increasing the pigment concentration, at the time of forming a black patterning film by preparing a black photosensitive composition, coating this composition on a substrate to form a photoresist film, and exposing the photoresist film by a photolithography method to form a black patterning film, the black pigment in a photoresist film also shields i-line (wavelength 365 nm) and h-line (wavelength 405 nm) which are ultraviolet rays, so that there are problems that ultraviolet rays do not reach the bottom of the photoresist film, and undercuts occur at the bottom, whereby a patterning film with high resolution cannot be formed. In particular, since the K-line has lower energy than the i-line, if patterning can be carried out with the h-line, it is advantageous for reducing a running cost, but there was a problem that there is no material having both high visible light shielding property and h-line transparency.

An object of the present invention is to provide a black-film-forming mixed powder when forming a black patterning film as a black pigment by transmitting light having a wavelength of 365 nm to 410 nm to form a patterning film having high resolution and the formed patterning film has high light shielding performance by shielding light having a wavelength of 500 nm to 1,100 nm and a production method therefor.

Means to Solve the Problems

The present inventors have found that if a trace amount of a peak corresponding to zirconium dioxide, a low-order oxide of zirconium or a low-order oxynitride of zirconium is present in an X-ray diffraction profile, when a black patterning film is formed using the powder as a black pigment, the light shielding property of the visible light region is remarkably lowered. On the other hand, the present inventors have found that when a black photosensitive composition is prepared by increasing a pigment concentration in order to obtain a higher light shielding property, the performance of transmitting light of i-line (wavelength 365 nm) is remarkably lowered, so that when a black patterning film is formed by using the powder as a black pigment, a patterning film with high resolution cannot be formed and yet light shielding property of the formed patterning film is lowered. On the other hand, they have attracted that titanium black shields light of i-line (wavelength: 365 nm) and h-line (wavelength: 405 nm) as mentioned above, but transmits light having a wavelength of around 450 nm, and reached the present invention.

A first aspect of the present invention relates to a black-film-forming mixed powder which comprises (A) a zirconium nitride powder and (B) a titanium nitride powder or a titanium oxynitride powder, wherein a content ratio of (A) the zirconium nitride powder and (B) the titanium nitride powder or the titanium oxynitride powder is within a range of (90:10) to (25:75) in terms of mass ratio (A:B), the zirconium nitride powder has a peak corresponding to zirconium nitride in an X-ray diffraction profile, but does not have a peak corresponding to zirconium dioxide, a peak corresponding to a low-order oxide of zirconium or a peak corresponding to a low-order oxynitride of zirconium, and in a spectrum of a dispersion in which the mixed powder is dispersed in a dispersing liquid with a concentration of 50 ppm, when a light transmittance at a wavelength of 400 nm is X, a light transmittance at a wavelength of 550 nm is Y, and a light transmittance at a wavelength of 1,000 nm is Z, X>10%, Y<10%, Z<16%, X/Y is 1.25 or more and Z/Y is 2.0 or less.

A second aspect of the present invention is a production method for a black-film-forming mixed powder which comprises mixing a zirconium dioxide powder, a metallic magnesium powder and a magnesium nitride powder so that metallic magnesium is in a ratio of 2.0 to 6.0-fold mol to zirconium dioxide and magnesium nitride is in a ratio of 0.3 to 3.0-fold mol to zirconium dioxide to obtain a first mixture, then, sintering the first mixture under an atmosphere of a nitrogen gas alone, a mixed gas of a nitrogen gas and a hydrogen gas or a mixed gas of a nitrogen gas and an ammonia gas at a temperature of 650 to 900° C. to reduce the zirconium dioxide powder to prepare (A) a zirconium nitride powder containing no zirconium dioxide, a low-order oxide of zirconium or a low-order oxynitride of zirconium, and mixing the prepared (A) zirconium nitride powder and (B) a titanium nitride powder or a titanium oxynitride powder within a range of (90:10) to (25:75) in terms of a mass ratio (A:B).

A third aspect of the present invention is a black photosensitive composition which comprises the black-film-forming mixed powder of the first aspect or the black-film-forming mixed powder produced by the method of the second aspect as a black pigment.

A fourth aspect of the present invention is a method for forming a black patterning film using the black photosensitive composition of the third aspect.

Effects of the Invention

In the black-film-forming mixed powder of the first aspect of the present invention, (A) the zirconium nitride powder constituting the mixed powder does not contain zirconium dioxide, a low-order oxide of zirconium and a low-order oxynitride of zirconium, and (A) the zirconium nitride powder and (B) the titanium nitride powder or the titanium oxynitride powder are contained within the range of (90:10) to (25:75) in terms of a mass ratio (A:B), so that in a spectrum of a dispersion in which the mixed powder is dispersed in a dispersing liquid with a concentration of 50 ppm, when a light transmittance at a wavelength of 400 nm is X, a light transmittance at a wavelength of 550 nm is Y, and a light transmittance at a wavelength of 1,000 nm is Z, it has characteristics that X>10%, Y<10%, Z<16%, and X/Y is 1.25 or more and Z/Y is 2.0 or less. By being X, Y, Z, X/Y and Z/Y within the above-mentioned ranges, when a black patterning film is formed as a black pigment, ultraviolet rays can be further transmitted and a patterning film with high resolution can be formed, and the formed patterning film has high light shielding property.

In the production method for a black-film-forming mixed powder of the second aspect of the present invention, in producing (A) the zirconium nitride powder, as compared with the production method of Patent document 2 in which a mixture of a zirconium dioxide powder, a metallic magnesium powder and a magnesium oxide powder is sintered in an atmosphere containing a nitrogen gas or an inert gas containing a nitrogen gas, magnesium nitride is used instead of magnesium oxide, so that nitriding efficiency of zirconium dioxide is remarkably improved. That is, when magnesium oxide is contained as in Patent document 2, the metallic magnesium is partially used for nitriding magnesium oxide, but when magnesium nitride is used as in the present invention, the metallic magnesium is used for nitriding zirconium dioxide alone so that reaction efficiency is improved.

Further, in producing (A) the zirconium nitride powder, the reaction proceeds even with the nitrogen gas alone, but by sintering the mixture in an atmosphere of a mixed gas of a nitrogen gas and a hydrogen gas or a mixed gas of a nitrogen gas and an ammonia gas, the reduction reaction is further promoted and reaction efficiency is further enhanced so that a zirconium nitride powder alone having no zirconium dioxide, a low-order oxide of zirconium and a low-order oxynitride of zirconium can be produced even with a smaller amount of the metallic magnesium.

By mixing the (A) prepared zirconium nitride powder and (B) the titanium nitride powder or the titanium oxynitride powder within the range of (90:10) to (25:75) in a mass ratio (A:B), when a black patterning film is formed by using the mixed powder as a black pigment, ultraviolet rays can be further transmitted and a patterning film with high resolution can be formed, and yet, the formed patterning film has high light shielding property.

According to the black photosensitive composition of the third aspect of the present invention, (A) the zirconium nitride powder constituting the mixed powder as a black pigment does not contain zirconium dioxide, a low-order oxide of zirconium and a low-order oxynitride of zirconium, and (A) the zirconium nitride powder and (B) the titanium nitride powder or the titanium oxynitride powder are contained within the range of (90:10) to (25:75) in a mass ratio (A:B), so that when a black patterning film is formed by using the composition, a patterning film with high resolution can be formed, and yet the formed patterning film has high light shielding property.

According to the method of forming a black patterning film of the fourth aspect of the present invention, a patterning film with high resolution can be formed, and yet the formed patterning film has high light shielding property.

EMBODIMENTS TO CARRY OUT THE INVENTION

Figure 1:
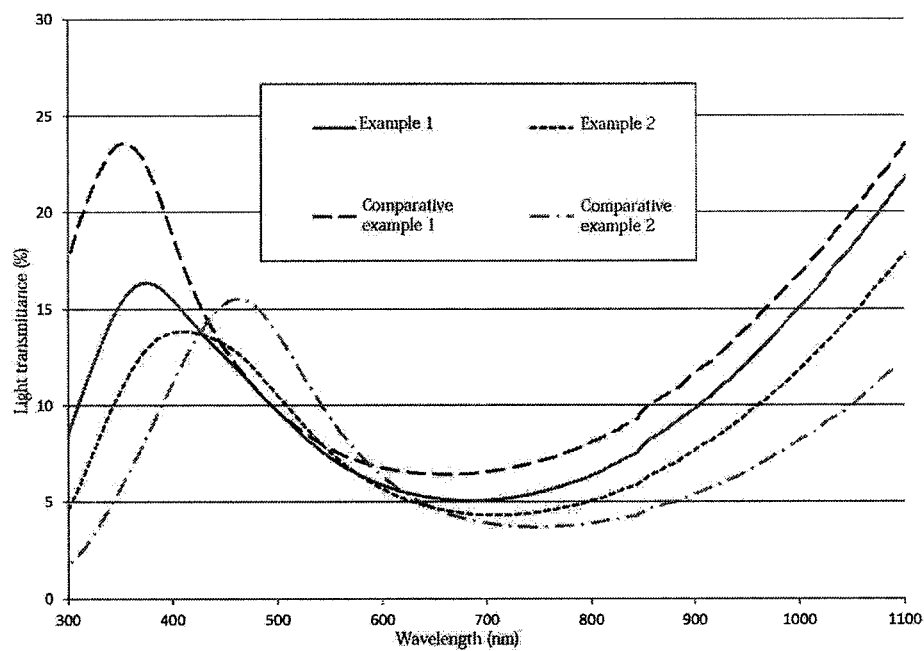
FIG. 1 is a spectral curve showing the light transmittance in a dispersed liquid obtained by diluting powders obtained in Examples 1 and 2 of the present invention and Comparative examples 1 and 2 to a powder concentration of 50 ppm.

Next, embodiments to carry out the present invention will be explained.

[Black-Film-Forming Mixed Powder]

The black-film-forming mixed powder of the present embodiment contains (A) a zirconium nitride powder and (B) a titanium nitride powder or a titanium oxynitride powder, a content ratio of (A) the zirconium nitride powder and (B) the titanium nitride powder or the titanium oxynitride powder is in a mass ratio (A:B) in the range of (90:10) to (25:75), preferably in the range of (80:20) to (40:60). If the ratio of (A) the zirconium nitride powder exceeds 90, and the ratio of (B) the titanium nitride powder or the titanium oxynitride powder is less than 10, when a black film is formed from the mixed powder, light shielding property of the black film at a wavelength of 1,000 nm becomes inferior. Also, if the ratio of (A) the zirconium nitride powder is less than 25, and the ratio of (B) the titanium nitride powder or the titanium oxynitride powder exceeds 75, when a black film is formed from the mixed powder, light transmittance of the black film at a wavelength of 400 nm is inferior, and a patterning film with high resolution can be difficulty obtained.

In addition, (A) the zirconium nitride powder constituting the black-film-forming mixed powder has a characteristic that it has a peak corresponding to zirconium nitride in an X-ray diffraction profile, but does not have a peak corresponding to zirconium dioxide, a peak corresponding to a low-order oxide of zirconium or a peak corresponding to a low-order oxynitride of zirconium. It is preferable that the zirconium nitride powder has a specific surface area measured by the BET method of 20 to 90 $m^2/g$. If the specific surface area of the zirconium nitride powder is less than 20 $m^2/g$, it tends to be sedimented during long-term storage when it is used as a black resist, while if it exceeds 90 $m^2/g$, light shielding property tends to be insufficient when forming a patterning film as a black pigment. It is preferably 30 to 60 $m^2/g$.

In addition, (B) the titanium nitride powder or the titanium oxynitride powder constituting the black-film-forming mixed powder preferably has a specific surface area measured by the BET method of 10 to 90 $m^2/g$ for preventing sedimentation during long-term storage and for obtaining sufficient light shielding property when forming a patterning film as a black pigment. The powder (B) is constituted by a powder in which TiN is 100%, or consists mainly of TiN, but due to oxygen being mixed during synthesis or oxidation of the powder surface, it is constituted by a titanium oxynitride powder which partially contains oxygen.

Further, the black-film-forming mixed powder has characteristics that, in a spectrum of a dispersion in which the mixed powder is dispersed in a dispersing liquid with a concentration of 50 ppm, when a light transmittance at a wavelength of 400 nm is X, a light transmittance at a wavelength of 550 nm is Y, and a light transmittance at a wavelength of 1,000 nm is Z, X>10%, Y<10%, Z<16%, and X/Y is 1.25 or more and Z/Y is 2.0 or less. If X is 10% or less, the light transmittance at a wavelength of 400 nm is too low, when the patterning film is to be formed as a black pigment, the bottom portion of the photoresist film is not exposed, and undercut of the patterning film occurs whereby the patterning film with high resolution cannot be obtained. If Y is 10% or more, the light transmittance at a wavelength of 550 nm is too high, and if Z is 16% or more, the light transmittance at a wavelength of 1,000 nm is too high, both are inferior in light shielding property. It is preferable that by being X>12%, Y<8% and Z<10%, and X/Y 1.25 or more, there is an effect of ultraviolet ray transmission and undercut of the patterning film does not occur. By being Z/Y 2.0 or less, there is a visible light shielding effect. It is preferable that X/Y is 1.3 or more and Z/Y is 1.8 or less.

In the following, raw materials of the black-film-forming mixed powder of the present embodiment will be explained for each raw material.

[Zirconium Dioxide Powder]

As the zirconium dioxide powder used for preparing the powder (A), for example, any of the powders of the zirconium dioxide such as monoclinic zirconium dioxide, cubic zirconium dioxide, yttrium stabilized zirconium dioxide or the like can be used, and from the viewpoint of increasing the rate of formation of the zirconium nitride powder, a monoclinic zirconium dioxide powder is preferable. The zirconium dioxide powder preferably has an average primary particle diameter of 500 nm or less in terms of the spherical form converted from the measured value of a specific surface area to obtain (A) the zirconium nitride powder having a specific surface area measured by the BET method of 20 to 90 $m^2/g$, and further preferably has the average primary particle diameter of 10 nm or more and 500 nm or less from easiness in handling of the powder.

[Metallic Magnesium Powder]

When the metallic magnesium powder used for preparing the powder (A) has a too small particle diameter, the reaction proceeds rapidly and the risk of operation becomes high, so that it is preferable that the powder has the particle diameter of 100 to 1,000 μm in a mesh pass of a sieve and in a granular state, and it is particularly preferably the powder having 200 to 500 μm in a granular state. Provided that even if all the metallic magnesium is not within the above-mentioned range of the particle diameter, it is sufficient if 80% by mass or more, particularly 90% by mass or more may be within the above-mentioned range.

[Magnesium Nitride Powder]

The magnesium nitride powder used for preparing the powder (A) coats the surface of zirconium nitride or the surface of titanium nitride at the time of sintering and relaxes the reducing power of the metallic magnesium to prevent sintering and grain growth of the zirconium nitride powder or the titanium nitride powder. The magnesium nitride powder preferably has an average primary particle diameter of 1,000 nm or less in terms of a spherical form converted from the measured value of the specific surface area, and is preferably 10 nm or more and 500 nm or less as the average primary particle diameter from the viewpoint of easiness in handling of the powder. Incidentally, not only magnesium nitride but also magnesium oxide is effective for prevention of sintering of zirconium nitride, so it is also possible to use magnesium nitride with which magnesium nitride is partially mixed.

[Titanium Dioxide Powder]

As the titanium dioxide powder used for preparing the powder (B), for example, either of a powder of titanium dioxide such as tetragonal (anatase type, rutile type)-based titanium dioxide, orthorhombic (brookite type)-based titanium dioxide and the like can be used, and the tetragonal titanium dioxide powder is preferable from the viewpoint of increasing the rate of formation of the titanium nitride powder. The titanium dioxide powder preferably has an average primary particle diameter of 70 nm or less in terms of the spherical form converted from the measured value of a specific surface area to obtain (B) the titanium nitride or titanium oxynitride powder having a specific surface area measured by the BET method of 10 to 90 m²/g, and further preferably has the average primary particle diameter of 10 nm or more and 60 nm or less from easiness in handling of the powder.

[Production Method for Black-Film-Forming Mixed Powder]

The production method for the black-film-forming mixed powder of this embodiment is a method for producing a mixed powder of (A) a zirconium nitride powder and (B) a titanium nitride or titanium oxynitride powder by separately preparing (A) the zirconium nitride powder and (B) the titanium nitride or titanium oxynitride powder, and uniformly mixing both of the powders at the above-mentioned mass ratio.

Preparation Method of Powder (A)

In this method, (A) the zirconium nitride powder is prepared by using each powder of zirconium dioxide ($ZrO_2$), metallic magnesium (metallic Mg) and magnesium nitride ($Mg_3N_2$) as a raw material, and sintering under a specific atmosphere at a specific temperature and time.

(1-1) Addition Amount of Metallic Magnesium Powder when Preparing Powder (A)

An amount of the metallic magnesium powder to be added to that of the zirconium dioxide powder affects the reducing power of the zirconium dioxide with amounts of the ammonia gas and the hydrogen gas in the atmospheric gas mentioned later. If the amount of the metallic magnesium is too small, it is difficult to obtain the intended zirconium nitride powder due to insufficient reduction, while if it is too much, the reaction temperature rapidly rises due to excessive metallic magnesium and there is a fear of causing grain growth of the powder which will become uneconomical. The metallic magnesium powder is so added, depending on the size of the particle diameter thereof, that the metallic magnesium becomes the ratio of 2.0 to 6.0-fold mol of that of the zirconium dioxide, by adding the metallic magnesium powder to the zirconium dioxide powder and mixing them. If it is less than 2.0-fold mol, the reducing power of the zirconium dioxide will be insufficient, while if it exceeds 6.0-fold mol, the reaction temperature rapidly rises due to excessive metallic magnesium and there is a fear of causing grain growth of the powder which will become uneconomical. It is preferably 3.0 to 5.0-fold mol.

(1-2) Addition Amount of Magnesium Nitride Powder when Preparing Powder (A)

The magnesium nitride powder is added, depending on the size of the particle diameter thereof, so that the magnesium nitride becomes the ratio of 0.3 to 3.0-fold mol of that of the zirconium dioxide, by adding to the zirconium dioxide and mixing them. If it is less than 0.3-fold mol, sintering of the zirconium nitride powder will not be prevented, while if it exceeds 3.0-fold mol, there is inconvenience that the used amount of the acidic solution required at the time of acid cleaning after sintering increases. It is preferably 0.4 to 2.0-fold mol.

(1-3) Reduction Reaction by Metallic Magnesium Powder when Preparing Powder (A)

A temperature at the time of reduction reaction by metallic magnesium for forming the zirconium nitride powder is 650 to 900° C., preferably 700 to 800° C. 650° C. is the melting temperature of metallic magnesium, and if the temperature is lower than this, reduction reaction of zirconium dioxide does not occur sufficiently. In addition, even if the temperature is made higher than 900° C., it is not preferable since its effect does not increase, heat energy is lost and sintering of particles proceeds. Also, a time of reduction reaction is preferably 30 to 90 minutes, more preferably 30 to 60 minutes.

A reaction vessel for carrying out the above-mentioned reduction reaction is preferably one having a lid so that raw materials and products are not scattered during the reaction. This is because, when the melting of metallic magnesium is started, the reduction reaction rapidly proceeds, the temperature rises accompanied thereby, the gas inside the vessel expands, and accordingly, there is a fear that the material inside of the vessel scatters to the outside.

(1-4) Atmospheric Gas at Reduction Reaction with Metallic Magnesium Powder when Preparing Powder (A)

The atmospheric gas at the time of the reduction reaction with the metallic magnesium powder is a nitrogen gas alone, or a mixed gas of a nitrogen gas and a hydrogen gas, or a mixed gas of a nitrogen gas and an ammonia gas. The above-mentioned reduction reaction is carried out in a stream of the above-mentioned mixed gas. The nitrogen gas in the mixed gas has a role of preventing contact between metallic magnesium or a reduction product and oxygen, whereby preventing their oxidation, and reacting nitrogen with zirconium to form zirconium nitride. The hydrogen gas or the ammonia gas in the mixed gas has a role of reducing zirconium dioxide together with metallic magnesium. The hydrogen gas is preferably contained in the above-mentioned mixed gas in an amount of 0 to 40% by volume, more preferably 10 to 30% by volume. Also, the ammonia gas is preferably contained in the above-mentioned mixed gas in an amount of 0 to 50% by volume, more preferably 0 to 40% by volume. By using this atmospheric gas having a reducing power, a zirconium nitride powder finally containing no low-order oxide of zirconium and low-order oxynitride of zirconium can be produced. On the other hand, if the ratio of the hydrogen gas or the ratio of the ammonia gas is higher than this range, the reduction proceeds but the nitrogen source becomes small so that a low-order oxide of zirconium or a low-order oxynitride of zirconium is formed, which is not desirable. In addition, the reason why the ratio of the ammonia gas is higher than the ratio of the hydrogen gas is considered that ammonia has higher nitriding ability as the gas than that of hydrogen.

(1-5) Treatment of Reactant after Sintering when Preparing Powder (A)

The reactant obtained by sintering the mixture comprising the zirconium dioxide powder, metallic magnesium and the magnesium nitride powder under the atmosphere of the above-mentioned mixed gas is taken out from the reaction vessel and, finally, after cooling to room temperature, washed with an acid solution such as an aqueous hydrochloric acid solution and the like to remove magnesium oxide generated by oxidation of the metallic magnesium or magnesium nitride contained from the beginning of the reaction for preventing sintering of the product. With regard to this acid washing, it is preferable to carry out at a pH of 0.5 or more, particularly at a pH of 1.0 or more, and a temperature of 90° C. or lower. This is because there is a fear of eluting zirconium if the acidity is too strong or the temperature is too high. Then, after the acid washing, the pH is adjusted to 5 to 6 with aqueous ammonia or the like, the solid component is separated by filtration or centrifugal separation, and the solid component is dried and pulverized to obtain (A) a zirconium nitride powder.

In this embodiment, the zirconium nitride powder using metallic magnesium is mainly described, and it is also possible to produce this zirconium nitride powder by the nanoparticle plasma synthesis method. Specifically, it is a method in which a metallic zirconium powder is introduced into a plasma nanoparticle manufacturing apparatus, zirconium nitride nanoparticles are obtained under an $N_2$ gas atmosphere. The zirconium nitride synthesized by this method can give a powder also having a specific surface area measured by the BET method of 20 to 90 $m^2/g$ as in the present embodiment, but there are disadvantages that the metallic zirconium as a raw material has high flammability and danger, and further it is costly to increase.

Preparation Method of Powder (B)

As an example of a method for preparing (B) the titanium nitride or titanium oxynitride powder of this embodiment, a method for preparing the powder (B) by using the metallic magnesium powder as a reducing agent, and reducing the titanium dioxide powder by the metallic magnesium powder is explained.

(2-1) Addition Amount of Metallic Magnesium Powder when Preparing Powder (B)

An amount of the metallic magnesium powder to be added to that of the titanium dioxide powder affects the reducing power of the titanium dioxide with amounts of the ammonia gas and the hydrogen gas in the atmospheric gas mentioned later. If the amount of the metallic magnesium is too small, it is difficult to obtain the intended titanium nitride or titanium oxynitride powder due to insufficient reduction, while if it is too much, the reaction temperature rapidly rises due to excessive metallic magnesium and there is a fear of causing grain growth of the powder which will become uneconomical. The metallic magnesium powder is added, depending on the size of the particle diameter thereof, so that the metallic magnesium becomes the ratio of 2.0 to 6.0-fold mol of that of the titanium dioxide, by adding the metallic magnesium powder to the titanium dioxide powder and mixing them. If it is less than 2.0-fold mol, the reducing power of the titanium dioxide will be insufficient, while if it exceeds 6.0-fold mol, the reaction temperature rapidly rises due to excessive metallic magnesium and there is a fear of causing grain growth of the powder which will become uneconomical. It is preferably 2.5 to 5.0-fold mol.

(2-2) Addition Amount of Magnesium Nitride Powder when Preparing Powder (B)

The magnesium nitride powder is added to and mixed with titanium dioxide so that the magnesium nitride becomes a ratio of 0.2 to 3.0-fold mol to that of titanium dioxide depending on the size of the particle size. If it is less than 0.2-fold mol, sintering of the titanium nitride or titanium oxynitride powder will not be prevented, while if it exceeds 3.0-fold mol, there is inconvenience that the used amount of the acidic solution required at the time of acid cleaning after sintering increases. It is preferably 0.3 to 2.5-fold mol.

(2-3) Reduction Reaction by Metallic Magnesium Powder when Preparing Powder (B)

A temperature and a reaction time during the reduction reaction with the metallic magnesium to form the titanium nitride or titanium oxynitride powder are the same as those for preparing the powder (A). Also, a reaction vessel for carrying out this reduction reaction is the same as the reaction vessel for preparing the powder (A).

(2-4) Atmospheric Gas at Reduction Reaction with Metallic Magnesium Powder when Preparing Powder (B)

The atmospheric gas at the time of the reduction reaction with the metallic magnesium powder when preparing the powder (B) is the same as the atmospheric gas at the time of preparing the powder (A). This reduction reaction is carried out in a gas stream of the above-mentioned mixed gas. The nitrogen gas in the mixed gas has a role of preventing contact between metallic magnesium or a reduction product and oxygen, whereby preventing their oxidation, and reacting nitrogen with titanium to form titanium nitride or titanium oxynitride. The hydrogen gas or the ammonia gas in the mixed gas has a role of reducing titanium dioxide together with the metallic magnesium. A ratio of the hydrogen gas and the ammonia gas contained in the mixed gas is the same as in the case of preparing the powder (A).

(2-5) Treatment of Reactant after Sintering when Preparing Powder (B)

Treatment of the reactant obtained by sintering a mixture of the titanium dioxide powder, metallic magnesium and the magnesium nitride powder in the atmosphere of the above-mentioned mixed gas is the same as the treatment of the reactant when preparing powder (A). That is, after washing with an acid, a pH is adjusted to 5 to 6 with aqueous ammonia or the like, the solid component is separated by filtration or centrifugal separation, the solid component is dried, and pulverized to prepare (B) the titanium nitride powder or the titanium oxynitride powder.

Incidentally, with regard to a production method for (B) the titanium nitride powder or the titanium oxynitride powder, an example in which the titanium dioxide powder is subjected to reducing treatment with the metallic magnesium powder has been described, but the present invention is not limited to this method, and there may be mentioned a method in which the titanium dioxide powder is sintered at a temperature of 650 to 900° C. under an atmosphere of a mixed gas of a nitrogen gas and a hydrogen gas, or a mixed gas of a nitrogen gas and an ammonia gas to reduce the titanium dioxide powder to prepare (B) a titanium nitride or titanium oxynitride powder, a method in which the titanium dioxide powder is evaporated by high-frequency thermal plasma, nitrogen is introduced as a carrier gas and nitriding is carried out during the cooling process to prepare (B) a titanium nitride or titanium oxynitride powder, or a method in which an ammonia gas is blown at the peripheral portion of the plasma to prepare (B) a titanium nitride or titanium oxynitride powder or the like. As long as it has the above-mentioned specific surface area, a commercially available product may be used as the (B) titanium nitride or titanium oxynitride powder.

Production of Black-Film-Forming Mixed Powder from Prepared Powder (A) and Powder (B)

After weighing (A) the zirconium nitride powder and the (B) titanium nitride or titanium oxynitride powder each prepared separately with the above-mentioned mass ratio, these are uniformly mixed by using, for example, a Henschel mixer to produce a black-film-forming mixed powder.

[Method for Forming Patterning Film Using Mixed Powder as Black Pigment]

A method of forming a patterning film typified by a black matrix using the obtained mixed powder as a black pigment will be described. First, the above-mentioned mixed powder is dispersed in a photosensitive resin to prepare a black photosensitive composition. Then, the black photosensitive composition is coated on a substrate, and prebaking is carried out to evaporate the solvent to form a photoresist film. Next, the photoresist film is exposed to be in the shape of a predetermined pattern through a photomask, developed with an alkali developing solution to dissolve and remove the unexposed portion of the photoresist film, and then, preferably subjecting to post-baking to form a predetermined black patterning film.

As an index representing a light shielding property (attenuation of transmittance) of the formed patterning film, an optical density, i.e., an OD (Optical Density) value has been known. The patterning film formed by using the mixed powder of the present embodiment has a high OD value. Here, the OD value is a logarithmic representation of the degree of absorption of light as it passes through the patterning film, and is defined by the following equation (1). In the equation (1), I is a transmitted light quantity, and $I_0$ is an incident light quantity.

$$OD\ value = -\log_{10}(I/I_0) \quad (1)$$

As the above-mentioned substrate, for example, there may be mentioned glass, silicon, polycarbonate, polyester, aromatic polyamide, polyamideimide, polyimide, and the like. In addition, to the above-mentioned substrate, if desired, an appropriate pretreatment such as chemical treatment with a silane coupling agent, and the like, plasma treatment, ion plating, sputtering, gas phase reaction method, vacuum vapor deposition or the like may be optionally applied. When the black photosensitive composition is to be applied to a substrate, an appropriate coating method such as spin coating, cast coating, roll coating or the like can be adopted. A thickness of the coating is, as a thickness after drying, in general, 0.1 to 10 μm, preferably 0.2 to 7.0 μm, more preferably 0.5 to 6.0 μm. As the radiation used when the patterning film is formed, in the present embodiment, radiation having a wavelength in the range of 250 to 410 nm is preferable. An irradiation energy quantity of the radiation is preferably 10 to 10,000 J/m². Also, as the above-mentioned alkali developing solution, for example, an aqueous solution of sodium carbonate, sodium hydroxide, potassium hydroxide, tetramethylammonium hydroxide, choline, 1,8-diazabicyclo-[5.4.0]-7-undecene, 1,5-diazabicyclo-[4.3.0]-5-nonene, and the like are preferable. To the above-mentioned alkali developing solution, for example, a suitable amount of a water-soluble organic solvent such as methanol, ethanol or the like, or a surfactant or the like may be added. Incidentally, after alkali development, it is usually washed with water. As the developing treatment method, a shower development method, a spray development method, a dipping (immersion) development method, a paddle (liquid filling) development method and the like can be applied, and the development condition is preferably for 5 to 300 seconds at normal temperature. The patterning film thus formed can be suitably used for a high precision liquid crystal, a black matrix material for organic EL, a light shielding material for an image sensor, a light shielding material for an optical material, a light shielding filter, an IR cut filter, a black cover lay film, and the like.

EXAMPLES

Next, Examples of the present invention will be explained in detail together with Comparative examples.

[Preparation Example of Zirconium Nitride Powder (A)]

First, Preparation examples No. A-1 to No. A-13 of (A) the zirconium nitride powder is explained. Preparation examples No. A-1 to No. A-6 are examples satisfying the production conditions of the second aspect, and Preparation examples No. A-7 to No. A-13 are examples not satisfying the production conditions of the second aspect.

<No. A-1>

To 7.4 g of a monoclinic zirconium dioxide powder having an average primary particle diameter of 50 nm calculated from the specific surface area measured by the BET method were added 7.3 g of a metallic magnesium powder having an average primary particle diameter of 150 μm and 3.0 g of a magnesium nitride powder having an average primary particle diameter of 200 nm, and uniformly mixed by a reaction apparatus in which a boat made of graphite has been equipped in a glass tube made of quartz. At this time, an added amount of the metallic magnesium was 5.0-fold mol of zirconium dioxide, and an added amount of the magnesium nitride was 0.5-fold mol of zirconium dioxide. The mixture was sintered at a temperature of 700° C. for 60 minutes under an atmosphere of a nitrogen gas to obtain a sintered product. The sintered product was dispersed in 1 liter of water, 10% hydrochloric acid was gradually added thereto to wash the product at a pH of 1 or more while maintaining the temperature to 100° C. or lower, and then, adjusted to a pH of 7 to 8 with 25% aqueous ammonia and filtered. The filtered solid content was redispersed in water with 400 g/liter, and once again, acid washing and pH adjustment with aqueous ammonia were carried out in the same manner as mentioned above, followed by filtration. Thus, acid washing and pH adjustment with aqueous ammonia were repeated twice, then, the filtrate was dispersed in ion exchanged water with 500 g/liter in terms of the solid content, and after subjecting to stirring under heating at 60° C. and adjustment of a pH to 7, it was filtered by a suction filtering apparatus, further washed with an equal amount of ion exchange water, and dried with a hot air dryer at a set temperature of 120° C. to prepare (A) a zirconium nitride powder.

<No. A-2>

In the same manner as in Preparation example No. A-1 using the same raw materials as in Preparation example No. A-1 except that an added amount of the metallic magnesium was changed to 2.0-fold mol of zirconium dioxide, (A) a zirconium nitride powder was prepared.

<No. A-3>

In the same manner as in Preparation example No. A-1 using the same raw materials as in Preparation example No. A-1 except that an added amount of the magnesium nitride was changed to 0.3-fold mol of zirconium dioxide, (A) a zirconium nitride powder was prepared.

<No. A-4>

In the same manner as in Preparation example No. A-1 using the same raw materials as in Preparation example No. A-1 except that an added amount of the magnesium nitride was changed to 3.0-fold mol of zirconium dioxide and the sintering temperature was changed to 650° C., (A) a zirconium nitride powder was prepared.

<No. A-5>

In the same manner as in Preparation example No. A-1 using the same raw materials as in Preparation example No. A-1 except that the sintering temperature was changed to 650° C., (A) a zirconium nitride powder was prepared.

<No. A-6>

In the same manner as in Preparation example No. A-1 using the same raw materials as in Preparation example No. A-1 except that the sintering temperature was changed to 900° C., (A) a zirconium nitride powder was prepared.

<No. A-7>

In accordance with the method shown in Preparation example No. A-1, a fine particle low-order oxide of zirconium-zirconium nitride composite was obtained by the method shown in Example 1 of Patent document 2. That is, 7.2 g of a zirconium dioxide powder having an average primary particle diameter of 19 nm and 3.3 g of fine particle magnesium oxide having an average primary particle diameter of 20 nm were mixed and pulverized to obtain a mixed powder A. To 0.5 g of the mixed powder was added 2.1 g of a metallic magnesium powder having an average primary particle diameter of 150 μm and mixed to obtain a mixed powder B. At this time, the added amounts of the metallic magnesium and the magnesium oxide were 1.4-fold mol and 1.4-fold mol of zirconium dioxide, respectively. The mixed powder B was sintered at a temperature of 700° C. for 60 minutes under an atmosphere of a nitrogen gas. Subsequently, in the same manner as in Preparation example No. A-1, a fine particle low-order oxide of zirconium-zirconium nitride composite (A) was prepared.

<No. A-8>

To 7.2 g of a zirconium dioxide powder having an average primary particle diameter of 40 nm were added 7.1 g of a metallic magnesium powder having an average primary particle diameter of 150 μm and 2.9 g of a magnesium nitride powder having an average primary particle diameter of 200 nm, and uniformly mixed in the same matter as in Preparation example No. A-1. At this time, added amounts of the metallic magnesium and the magnesium nitride were 5.0-fold mol and 0.5-fold mol to zirconium dioxide, respectively. The reaction gas which is an atmospheric gas was made 100% by volume of a nitrogen gas, the sintering temperature was made 1,000° C., and the sintering time was made 60 minutes. Other than the above, the same raw materials as in Preparation example No. A-1 were used to prepare (A) a zirconium nitride powder in the same manner as in Preparation example No. A-1.

<No. A-9>

In the same manner as in Preparation example No. A-1 using the same raw materials as in Preparation example No. A-1 except that an added amount of the metallic magnesium was changed to 1.5-fold mol of zirconium dioxide, (A) a zirconium nitride powder was prepared.

<No. A-10>

In the same manner as in Preparation example No. A-1 using the same raw materials as in Preparation example No. A-1 except that an added amount of the metallic magnesium was changed to 6.5-fold mol of zirconium dioxide, (A) a zirconium nitride powder was prepared.

<No. A-11>

In the same manner as in Preparation example No. A-1 using the same raw materials as in Preparation example No. A-1 except that an added amount of the magnesium nitride was changed to 0.2-fold mol of zirconium dioxide, (A) a zirconium nitride powder was prepared.

<No. A-12>

In the same manner as in Preparation example No. A-1 using the same raw materials as in Preparation example No. A-1 except that an added amount of the magnesium nitride was changed to 3.5-fold mol of zirconium dioxide, (A) a zirconium nitride powder was prepared.

<No. A-13>

In the same manner as in Preparation example No. A-1 using the same raw materials as in Preparation example No. A-1 except that the sintering temperature was changed to 600° C., (A) a zirconium nitride powder was prepared.

Each of the production method of Preparation examples No. A-1 to 13, the molar ratio of zirconium dioxide to the added amounts of the metallic magnesium and the magnesium nitride or the magnesium oxide (hereinafter referred to as Mg source), the kind of the reaction gas which is an atmospheric gas and the ratio in terms of % by volume, the sintering temperature and the sintering time are shown in Table 1.

TABLE 1

| | | | | Production conditions | | | Presence or absence of X-ray diffraction profile | | |
|---|---|---|---|---|---|---|---|---|---|
| | Metallic Mg/$ZrO_2$ (molar ratio) | $Mg_3N_2$/$ZrO_2$ (molar ratio) | MgO/$ZrO_2$ (molar ratio) | Kind of reaction gas (volume % ratio) | Sintering temperature (° C.) | Sintering time (min) | Position corresponding to ZrN | Position corresponding to $ZrO_2$ | Position corresponding to $Zr_2N_2O$ |
| No. A-1 | 5.0 | 0.5 | — | $N_2$ = 100% | 700 | 60 | Present | None | None |
| No. A-2 | 2.0 | 0.5 | — | $N_2$ = 100% | 700 | 60 | Present | None | None |
| No. A-3 | 5.0 | 0.3 | — | $N_2$ = 100% | 700 | 60 | Present | None | None |
| No. A-4 | 5.0 | 3.0 | — | $N_2$ = 100% | 650 | 60 | Present | None | None |
| No. A-5 | 5.0 | 0.5 | — | $N_2$ = 100% | 650 | 60 | Present | None | None |
| No. A-6 | 5.0 | 0.5 | — | $N_2$ = 100% | 900 | 60 | Present | None | None |
| No. A-7 | 1.4 | — | 1.4 | $N_2$ = 100% | 700 | 60 | Present | None | Present |
| No. A-8 | 5.0 | 0.5 | — | $N_2$ = 100% | 1,000 | 60 | Present | None | None |
| No. A-9 | 1.5 | 0.5 | — | $N_2$ = 100% | 700 | 60 | Present | Present | Present |
| No. A-10 | 6.5 | 0.5 | — | $N_2$ = 100% | 700 | 60 | Present | None | None |
| No. A-11 | 5.0 | 0.2 | — | $N_2$ = 100% | 700 | 60 | Present | None | None |
| No. A-12 | 5.0 | 3.5 | — | $N_2$ = 100% | 700 | 60 | Present | None | None |
| No. A-13 | 5.0 | 0.5 | — | $N_2$ = 100% | 600 | 60 | Present | Present | None |

[Preparation Example of (B) Titanium Nitride or Titanium Oxynitride Powder]

Next, Preparation examples No. B-1 to No. B-4 of (B) a titanium nitride or titanium oxynitride powder are explained.

<No. B-1>

To 7.2 g of a titanium dioxide powder having an average primary particle diameter of 30 nm calculated from the specific surface area measured by the BET method were added 11 g of a metallic magnesium powder having an average primary particle diameter of 150 μm and 4.6 g of a magnesium nitride powder having an average primary particle diameter of 200 nm, and uniformly mixed by a reaction apparatus in which a boat made of graphite has been equipped in a glass tube made of quartz. At this time, an added amount of the metallic magnesium was 5.0-fold mol of titanium dioxide, and an added amount of the magnesium nitride was 0.5-fold mol of titanium dioxide. The mixture was sintered at a temperature of 700° C. for 60 minutes under an atmosphere of a nitrogen gas to obtain a sintered product. The sintered product was dispersed in 1 liter of water, 10% hydrochloric acid was gradually added thereto to wash the product at a pH of 1 or more while maintaining the temperature to 100° C. or lower, and then, adjusted to a pH of 7 to 8 with 25% aqueous ammonia and filtered. The filtered solid content was redispersed in water with 400 g/liter, and once again, acid washing and pH adjustment with aqueous ammonia were carried out in the same manner as mentioned above, followed by filtration. Thus, acid washing and pH adjustment with aqueous ammonia were repeated twice, then, the filtrate was dispersed in ion exchanged water with 500 g/liter in terms of the solid content, and after subjecting to stirring under heating at 60° C. and adjustment of a pH to 7, it was filtered by a suction filtering apparatus, further washed with an equal amount of ion exchange water, and dried with a hot air dryer at a set temperature of 120° C. to prepare (B-1) a titanium nitride powder.

<No. B-2>

7.2 g of a titanium dioxide powder having an average primary particle diameter of 30 nm calculated from the specific surface area measured by the BET method was subjected to a reduction reaction at 900° C. with an ammonia gas to obtain a black titanium oxynitride powder.

<No. B-3>

A titanium nitride powder (available from Nissin Engineering Inc.) prepared by the thermal plasma method was prepared.

<No. B-4>

A titanium nitride powder (available from Hefei Kei'er Nano Teck Co., Ltd., China) prepared by the thermal plasma method was prepared.

Next, (A) the zirconium nitride powder extracted from Preparation examples No. A-1 to No. A-13 and the (B) titanium nitride or titanium oxynitride powder extracted from Preparation examples No. B-1 to No. B-4 were uniformly mixed with a mass ratio (A:B) shown in Table 2 to prepare 26 kinds of mixed powders of Examples 1 to 15 and Comparative examples 1 to 11. The contents are shown in Table 2.

<Comparative Test and Evaluation Part 1>

The mixed powder of the powder (A) and the powder (B) obtained in Examples 1 to 15 and Comparative examples 3 to 11, the powder of only the powder (B) obtained in Comparative example 1, and the powder of only the powder (A) obtained in Comparative example 2 were used as samples, and (1) an X-ray diffraction profile, (2) a spectral curve of the dispersion with a powder concentration of 50 ppm, (3) light transmittance X at 400 nm, light transmittance Y at 550 nm and light transmittance Z at 1,000 nm and (4) X/Y and Z/Y were measured or calculated by the methods mentioned in detail below. The respective measurement results or calculation results are shown in Table 2. In Table 2, "TiN—TiNO" means titanium nitride or titanium oxynitride.

TABLE 2

| | Preparation example No. of (A) ZrN powder | Preparation example No. of (B) TiN—TiNO powder | Mass ratio (A:B) | Dispersion transmitted spectrum with powder concentration of 50 ppm | | | | | OD value | |
| | | | | Light transmittance X at 400 nm | Light transmittance Y at 550 nm | Light transmittance Z at 1,000 nm | X/Y | Z/Y | UV transmittance at 370 nm | Visible ray shielding property at 650 nm |
|---|---|---|---|---|---|---|---|---|---|---|
| Example 1 | No. A-1 | No. B-1 | 70:30 | 15.6 | 7.5 | 15.0 | 2.1 | 2.0 | Excellent | Excellent |
| Example 2 | No. A-1 | No. B-1 | 50:50 | 13.8 | 7.6 | 11.9 | 1.8 | 1.6 | Excellent | Excellent |
| Example 3 | No. A-1 | No. B-1 | 90:10 | 18.0 | 7.9 | 15.6 | 2.3 | 2.0 | Excellent | Good |
| Example 4 | No. A-1 | No. B-1 | 80:20 | 15.6 | 7.1 | 11.4 | 2.2 | 1.6 | Excellent | Excellent |
| Example 5 | No. A-1 | No. B-2 | 80:20 | 16.9 | 7.7 | 13.9 | 2.2 | 1.8 | Excellent | Excellent |
| Example 6 | No. A-1 | No. B-3 | 80:20 | 13.3 | 7.0 | 10.5 | 1.9 | 1.5 | Excellent | Good |
| Example 7 | No. A-2 | No. B-1 | 70:30 | 15.2 | 8.0 | 14.4 | 1.9 | 1.8 | Excellent | Good |
| Example 8 | No. A-3 | No. B-1 | 70:30 | 15.2 | 7.6 | 13.7 | 2.0 | 1.8 | Excellent | Excellent |
| Example 9 | No. A-4 | No. B-2 | 70:30 | 13.7 | 7.2 | 12.3 | 1.9 | 1.7 | Excellent | Excellent |
| Example 10 | No. A-1 | No. B-1 | 60:40 | 14.6 | 7.6 | 12.8 | 1.9 | 1.7 | Excellent | Excellent |
| Example 11 | No. A-2 | No. B-2 | 60:40 | 11.0 | 6.1 | 9.8 | 1.8 | 1.6 | Excellent | Excellent |
| Example 12 | No. A-5 | No. B-3 | 60:40 | 10.4 | 5.8 | 5.5 | 1.8 | 0.95 | Good | Excellent |
| Example 13 | No. A-6 | No. B-4 | 60:40 | 10.4 | 5.8 | 3.9 | 1.8 | 0.8 | Good | Excellent |
| Example 14 | No. A-1 | No. B-1 | 40:60 | 13.3 | 8.8 | 10.6 | 1.5 | 1.2 | Excellent | Excellent |
| Example 15 | No. A-1 | No. B-1 | 25:75 | 10.5 | 8.4 | 9.1 | 1.25 | 1.1 | Good | Excellent |
| Comparative example 1 | No. A-1 | — | 100:0 | 19.1 | 7.6 | 17.0 | 2.5 | 2.2 | Excellent | Poor |

TABLE 2-continued

| Preparation example | Preparation example | | Dispersion transmitted spectrum with powder concentration of 50 ppm | | | | | OD value | |
| | | | | | | | | Visible ray | |
| No. of (A) ZrN powder | No. of (B) TiN—TiNO powder | Mass ratio (A:B) | Light transmittance X at 400 nm | Light transmittance Y at 550 nm | Light transmittance Z at 1,000 nm | X/Y | Z/Y | UV transmittance at 370 nm | shielding property at 650 nm |
|---|---|---|---|---|---|---|---|---|---|
| Comparative example 2 | — | No. B-1 | 0:100 | 11.2 | 9.3 | 8.2 | 1.24 | 0.88 | Poor | Excellent |
| Comparative example 3 | No. A-1 | No. B-1 | 24:76 | 10.3 | 8.4 | 9.2 | 1.23 | 1.1 | Poor | Excellent |
| Comparative example 4 | No. A-1 | No. B-1 | 92:8 | 18.8 | 7.5 | 16.5 | 2.5 | 2.2 | Excellent | Poor |
| Comparative example 5 | No. A-7 | No. B-1 | 90:10 | 19.2 | 8.0 | 18.4 | 2.4 | 2.3 | Excellent | Poor |
| Comparative example 6 | No. A-8 | No. B-1 | 90:10 | 20.3 | 8.1 | 19.4 | 2.5 | 2.4 | Excellent | Poor |
| Comparative example 7 | No. A-9 | No. B-1 | 90:10 | 20.3 | 7.5 | 19.4 | 2.2 | 2.5 | Excellent | Poor |
| Comparative example 8 | No. A-10 | No. B-1 | 90:10 | 19.5 | 7.8 | 18.7 | 2.6 | 2.4 | Excellent | Poor |
| Comparative example 9 | No. A-11 | No. B-1 | 90:10 | 21.0 | 8.4 | 19.3 | 2.5 | 2.3 | Excellent | Poor |
| Comparative example 10 | No. A-12 | No. B-1 | 90:10 | 24.3 | 8.1 | 17.8 | 3.0 | 2.2 | Excellent | Poor |
| Comparative example 11 | No. A-13 | No. B-1 | 90:10 | 22.4 | 8.0 | 17.6 | 2.8 | 2.2 | Excellent | Poor |

Figure 2:
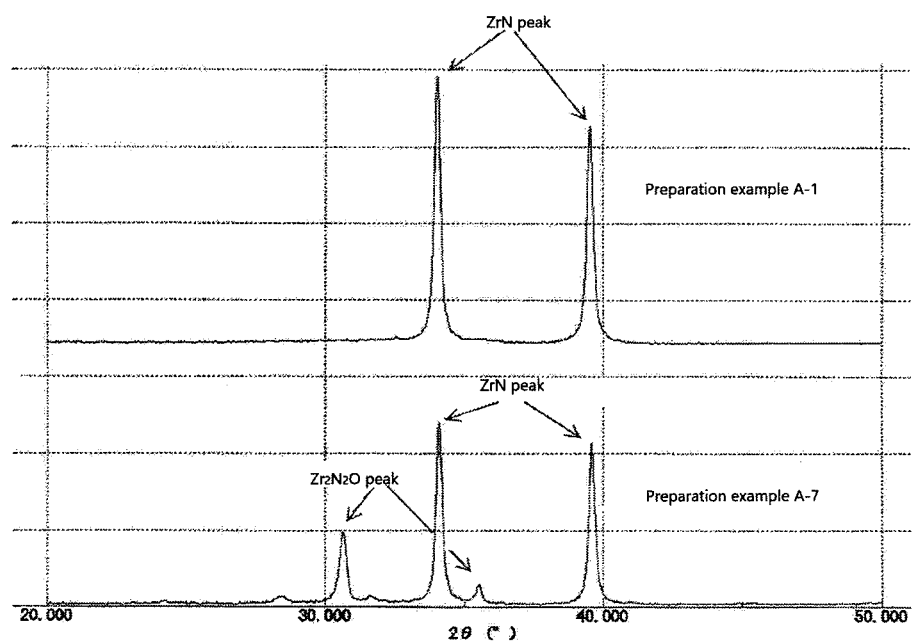
FIG. 2 is an X-ray diffraction profile of the zirconium nitride powder obtained in Preparation example No. A-1 and Preparation example No. A-7, respectively.

(1) X-ray diffraction profile: With regard to the samples of Preparation example No. A-1 and Preparation example No. A-7, by using an X-ray diffractometer (Model number: Miniflex II, manufactured by Rigaku Corporation), X-ray diffraction analysis was carried out from the X-ray diffraction profile by the θ-2θ method under conditions of an applied voltage of 45 kV and an applied current of 40 mA using CuKα ray. From the X-ray diffraction profile, the presence or absence of a peak corresponding to zirconium nitride (2θ=33.95°, 39.3°), a peak corresponding to zirconium dioxide)(2θ=30.2°, a peak corresponding to a low-order oxide of zirconium and a peak corresponding to a low-order oxynitride of zirconium (2θ=30.5°, 35.3°) were examined. The X-ray diffraction profile was shown in FIG. 2. In FIG. 2, "ZrN" means zirconium nitride, and "$Zr_2N_2O$" means a low-order oxynitride of zirconium, respectively.

(2) Spectral curve of dispersion with powder concentration of 50 ppm: With respect to each of the samples of Examples 1 to 15 and Comparative examples 1 to 11, these samples were separately placed in a circulating horizontal type bead mill (media: zirconia), an amine-based dispersing agent was added thereto, and dispersing treatment was carried out in a solvent of propylene glycol monomethyl ether acetate (PGM-AC). The obtained 26 kinds of dispersions were diluted 100,000-fold and a powder concentration was adjusted to 50 ppm. The light transmittance of each sample in this diluted dispersion was measured in the range of the wavelength from 240 nm to 1,300 nm using a spectrophotometer manufactured by Hitachi High-Tech Fielding Corporation (UH-4150), and each of the light transmittance (%) at the wavelength of 400 nm near h-line (405 nm), the wavelength of 550 nm and the wavelength of 1,000 nm was measured. In FIG. 1, four spectral curves of Example 1, Example 2, Comparative examples 1 and 2 are shown.

(3) Light transmittance X at 400 nm, light transmittance Y at 550 nm and light transmittance Z at 1,000 nm: The respective light transmittances X, Y and Z were read from spectral curves of each of the samples of Examples 1 to 15 and Comparative examples 1 to 11.

(4) X/Y: X/Y was calculated from the light transmittance X and the light transmittance Y read from the spectral curves of each of the samples of Examples 1 to 15 and Comparative examples 1 to 11, and Z/Y from the light transmittance Z and the light transmittance Y, respectively.

As clearly seen from FIG. 2, the sample of Preparation example No. A-7 had, in an X-ray diffraction profile, not only the peak corresponding to zirconium nitride (2θ=33.95°, 39.3°), but also the peak corresponding to a low-order oxynitride of zirconium (2θ=30.5°, 35.3°). To the contrary, the sample of Preparation example No. A-1 had a peak corresponding to zirconium nitride in an X-ray diffraction profile, while neither a peak corresponding to zirconium dioxide, a peak corresponding to a low-order oxide of zirconium nor a peak corresponding to a low-order oxynitride of zirconium was present.

As is apparent from FIG. 1 and Table 2, the samples of Comparative examples 1 and 4 to 11 had the transmittance X at 400 nm in the spectral transmission curve in the range of 18.8 to 24.3%, and the transmittance Y at 550 nm in the range of 7.5 to 8.4%. Also, the transmittance Z at 1,000 nm thereof were in the range of 16.5 to 19.4%. X/Y which is a ratio of the light transmittance Y to the light transmittance X of the samples of Comparative examples 1 and 4 to 11 was in the range of 2.2 to 3.0, which satisfied the requirement of the present invention of 1.25 or more, but Z/Y which is a ratio of the light transmittance Y to the light transmittance Z was in the range of 2.2 to 2.5, which did not satisfy the requirement of the present invention of 2.0 or less.

Also, the samples of Comparative examples 2 and 3 had the transmittance X at 400 nm in the spectral transmission curve were 11.2% and 10.3%, respectively, and the transmittance Y at 550 nm were 9.3% and 8.4%, respectively. In addition, the transmittance Z at 1,000 nm thereof were 8.2% and 9.2%, respectively. Z/Y which is a ratio of the light transmittance Y to the light transmittance Z of the samples of Comparative examples 2 and 3 were 0.88 and 1.1, respectively, which satisfied the requirement of the present invention of 2.0 or less, but X/Y which is a ratio of the light transmittance Y to the light transmittance X were 1.24 and 1.23, respectively, which did not satisfy the requirement of the present invention of 1.25 or more.

To the contrary, the samples of Examples 1 to 15 had the transmittance X at 400 nm in the spectral transmission curve in the range of 10.4 to 18.0%, and had the transmittance Y at 550 nm in the range of 5.8 to 8.8%. In addition, the transmittance Z at 1,000 nm thereof were in the range of 3.9 to 15.6%. X/Y which is a ratio of the light transmittance Y to the light transmittance X of the samples of Examples 1 to 15 were in the range of 1.5 to 2.3, which satisfied the requirement of the present invention of 1.25 or more, and Z/Y which is a ratio of the light transmittance Y to the light transmittance Z thereof were in the range of 0.8 to 2.0, which satisfied the requirement of the present invention of 2.0 or less.

<Comparative Test and Evaluation Part 2>

With regard to the samples obtained in Examples 1 to 15 and Comparative examples 1 to 11, an acrylic resin was mixed with a dispersed liquid used for measurement of the light transmittance with a ratio of black pigment:resin=6:4 by mass ratio to prepare a black photosensitive composition. This composition was spin-coated on a glass substrate so as to have a film thickness after sintering of 1 μm and sintered at a temperature of 250° C. for 60 minutes to form a film. The OD values of ultraviolet rays (central wavelength of 370 nm) and visible light (central wavelength of 650 nm) of the film were measured using a densitometer (densitometer) of a product name of D200 manufactured by Macbeth Co. based on the above-mentioned formula (1). The results are shown in Table 2. In Table 2, as a measure indicating the transmittance of ultraviolet rays, the OD value at 370 nm of ultraviolet rays (UV) of 2.0 or less is made "excellent", exceeding 2.0 and 2.5 or less is made "good", and exceeding 2.5 is made "poor". Also, as a measure indicating the light shielding property of visible light, the case where the OD value at 650 nm of visible light of exceeding 4.5 is made "excellent", 3.8 or more and 4.5 or less is made "good", and less than 3.8 is made "poor".

As is apparent from Table 2, with respect to the OD value as a measure showing the transmittance of the ultraviolet rays and light shielding property of the visible light, the sample of Comparative example 1 did not contain (B) the titanium nitride powder or the titanium oxynitride powder, so that the OD value at 650 nm of the visible light was low and it was "poor". Also, the sample of Comparative example 2 did not contain (A) the zirconium nitride powder, so that the OD value at 370 nm of UV was high and it was "poor". In addition, in the sample of Comparative example 3, the content ratio of the powder (A) was too low as 24 in the mass ratio of the powder (A) and the powder (B), so that the OD value at 370 nm of UV was high and it was "poor". Further, in the sample of Comparative example 4, the content ratio of the powder (B) was too low as 8 in the mass ratio of the powder (A) and the powder (B), so that the OD value at 650 nm of the visible light was low and it was "poor".

In addition, in the sample of Comparative example 5, reduction of zirconium dioxide was insufficient, so that the OD value at 650 nm of the visible light was low and it was "poor". Also, in the sample of Comparative example 6, the sintering temperature was too high as 1,000° C., so that the OD value at 650 nm of the visible light was low and it was "poor". Further, in the sample of Comparative example 11, the sintering temperature was too low as 600° C., so that the OD value at 650 nm of the visible light was low and it was "poor".

In addition, in the sample of Comparative example 7, it was prepared by mixing the metallic magnesium in an excessively small ratio as 1.5-fold mol of the zirconium dioxide, so that the OD value at 650 nm of the visible light was low and it was "poor". Also, in the sample of Comparative example 8, it was prepared by mixing the metallic magnesium in a too much ratio as 6.5-fold mol of the zirconium dioxide, so that the OD value at 650 nm of the visible light was low and it was "poor".

In addition, in the sample of Comparative example 9, it was prepared by mixing the magnesium nitride in an excessively small ratio as 0.2-fold mol of the zirconium dioxide, so that the OD value at 650 nm of the visible light was low and it was "poor". Also, in the sample of Comparative example 10, it was prepared by mixing the magnesium nitride in a too much ratio as 3.5-fold mol of the zirconium dioxide, so that the OD value at 650 nm of the visible light was low and it was "poor".

To the contrary, the samples of Examples 1 to 15 satisfy the requirements of the present invention, so that the OD value at 370 nm of ultraviolet rays (UV) was "excellent" or "good", and the OD value at 650 nm of the visible light was also "excellent" or "good". From these facts, it was found that the samples of Examples 1 to 15 are advantageous for patterning because they transmit ultraviolet rays in addition to high light shielding property of the visible light.

UTILIZABILITY IN INDUSTRY

The black-film-forming mixed powder of the present invention can be utilized for a high precision liquid crystal, a black matrix material for organic EL, a light shielding material for an image sensor, a light shielding material for an optical element, a light shielding filter, an IR cut filter, a black cover lay film, and the like.

The invention claimed is:

1. A black-film-forming mixed powder which comprises (A) a zirconium nitride powder and (B) a titanium nitride powder or a titanium oxynitride powder, wherein a content ratio of (A) the zirconium nitride powder and (B) the titanium nitride powder or the titanium oxynitride powder is within a range of (90:10) to (25:75) in terms of mass ratio (A:B), the zirconium nitride powder has a peak corresponding to zirconium nitride in an X-ray diffraction profile, but does not have a peak corresponding to zirconium dioxide, a peak corresponding to a low-order oxide of zirconium or a peak corresponding to a low-order oxynitride of zirconium, in a spectrum of a dispersion in which the mixed powder is dispersed in a dispersing liquid with a concentration of 50 ppm, when a light transmittance at a wavelength of 400 nm is X, a light transmittance at a wavelength of 550 nm is Y, and a light transmittance at a wavelength of 1,000 nm is Z, X>10%, Y<10%, Z<16%, X/Y is 1.25 or more and Z/Y is 2.0 or less;

wherein a black film formed by the black-film-forming mixed powder exhibits a greater light shielding property at a wavelength of 500 nm to 1,100 nm than when the mass ratio (A:B) is outside of the range of (90:10) to (25:75), and/or wherein a black film formed by the black-film-forming mixed powder exhibits greater light transmittance at a wavelength of 365 nm to 410 nm than when the mass ratio (A:B) is outside of the range of (9:10) to (25:75).

2. The black-film-forming mixed powder according to claim 1, wherein the mass ratio (A:B) is within a range of (80:20) to (40:60).

3. The black-film-forming mixed powder according to claim 1, wherein the zirconium nitride powder has a specific surface area measured by the BET method of 20 to 90 m$^2$/g, and the titanium nitride powder has a specific surface area measured by the BET method of 10 to 90 m$^2$/g.

* * * * *

UNITED STATES PATENT AND TRADEMARK OFFICE
CERTIFICATE OF CORRECTION

PATENT NO. : 10,870,578 B2  
APPLICATION NO. : 16/462341  
DATED : December 22, 2020  
INVENTOR(S) : Kageyama et al.

Page 1 of 1

It is certified that error appears in the above-identified patent and that said Letters Patent is hereby corrected as shown below:

In the Claims

Column 20, Line 67, Claim 1, Line 29, please change "(9:10)" to --(90:10)--

Signed and Sealed this
Eighteenth Day of May, 2021

Drew Hirshfeld
*Performing the Functions and Duties of the*
*Under Secretary of Commerce for Intellectual Property and*
*Director of the United States Patent and Trademark Office*